United States Patent [19]

Wakabayashi et al.

[11] Patent Number: 4,538,865
[45] Date of Patent: Sep. 3, 1985

[54] DEVICE FOR CONNECTING PRINTED WIRING BOARDS OR SHEETS

[75] Inventors: Tsutomu Wakabayashi, Tokyo; Mikihito Furuya, Yokohama, both of Japan

[73] Assignee: Nippon Kogaku K.K., Tokyo, Japan

[21] Appl. No.: 575,762

[22] Filed: Feb. 1, 1984

[30] Foreign Application Priority Data

Feb. 8, 1983 [JP] Japan .............................. 58-16093[U]

[51] Int. Cl.³ ............................................ H01R 23/66
[52] U.S. Cl. ................................................. 339/17 F
[58] Field of Search ....................... 339/17 F, 176 MF

[56] References Cited

U.S. PATENT DOCUMENTS 3,562,798  2/1971  Bragg, Jr. ...................... 339/17 CF
3,629,787 12/1971  Wilson ............................. 339/17 F Primary Examiner—Neil Abrams
Attorney, Agent, or Firm—Fitzpatrick, Cella, Harper & Scinto

[57] ABSTRACT

A device for connecting printed wiring boards or sheets as overlapped one on the other, is constructed with a pressing member having a top part and at least a pair of side walls depending from the side edges of the top part; an elastic member received into a space between the side walls with its bottom end part slightly protruding from the bottom edge of the side wall; a base plate, on which the mutually overlapped printed wiring boards or sheets are placed; and a pressure applying member which exerts force to press-contact the contact points on the printed wiring boards or sheets between the pressing member and the base plate through the elastic member.

3 Claims, 4 Drawing Figures

DEVICE FOR CONNECTING PRINTED WIRING BOARDS OR SHEETS

BACKGROUND OF THE INVENTION

1. Field of the Invention

This invention relates to a device for mechanically and electrically connecting printed wiring boards or sheets.

2. Description of the Prior Art

In recent years, electronic developments leading to size-reduction in various precision instruments and appliances have been under way. For example, in the field of photographic and cinematographic cameras, a number of electronic parts are incorporated therein, and the main bodies of such cameras have been made smaller and lighter. On account of such reduction in size, the space for electrical wiring within the camera has become narrower and narrower. In reflection of such circumstances, there are now used, for the purpose of effectively utilizing the limited space in the camera, many numbers of printed wiring boards such as printed base plates or flexible printed sheets, which are capable of achieving high density wiring in the interior of the cameras.

For joining contacts in these printed wiring boards, there have generally been adopted soldering and pressure welding. The soldering, however, has such a disadvantage that the soldered part lacks flexibility and, moreover, the land is prone to separate from the board or sheet. Therefore, this method is not suitable for connection of the flexible printed wiring boards or sheets which are used in most cases by being bent or curved in a narrow space of the camera, and so forth. In view of such shortcoming in the soldering method, the connection of the contact points has been done mostly by the pressure welding in recent years.

The pressure welding method for joining the contact points, however, is difficult in adjustment of tightening force applied to the printed wiring boards or sheets as put together. If it is too strong, the conductor patterns on the printed wiring boards are damaged or the insulation layers thereon are broken; inversely, if the tightening force is too weak, the contacts are separated from each other to become unable to conduct electrically, both cases bringing about inconveniences in connecting the printed wiring boards.

SUMMARY OF THE INVENTION

It is therefore an object of the present invention to provide a connecting device for the printed wiring boards, with which the electrical contacts on the printed wiring boards can be connected together without failure by simple operations.

The foregoing object, other objects as well as specific construction and functions of the connecting device for the printed wiring boards according to the present invention will become more apparent and understandable from the following detailed description of a few preferred embodiments thereof, when read in connection with the accompanying drawings.

DESCRIPTION OF PREFERRED EMBODIMENTS

Figure 1:
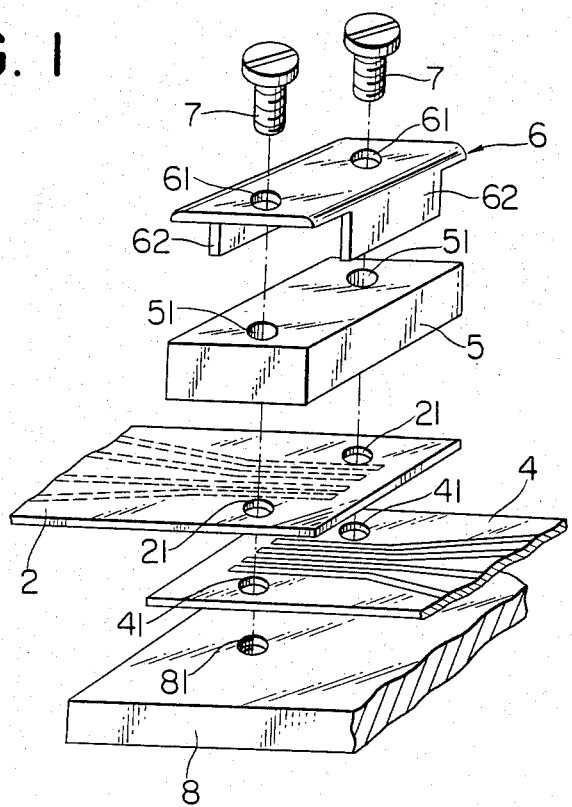
FIG. 1 is an exploded perspective view showing a preferred embodiment of the connecting device for the printed wiring boards according to the present invention.

The printed wiring board 2, 4 shown in FIG. 1 have the circuit patterns of electrically conductive material printed on their lower and upper surfaces, respectively. In the neighborhood of the connecting terminals of the circuit patterns on each printed wiring board, there are perforated holes 21 (41). For the purpose of electrically connecting the circuits on these two printed wiring boards, there are provided an elastic member 5, a pressing member 6, and tightening bolts 7. The two printed wiring boards 2, 4 are connected to each other both mechanically and electrically by application of tightening force thereto with the threaded bolts 7 which are caused to pass through the holes 51, 61 respectively perforated in the elastic member 5, being in contact with the printed wiring board 2, and the pressing member 6 covering this elastic member 5, and then are screwed in threaded holes 18 formed in the base plate 8. The elastic member 5 is made of an elastic material such as silicone rubber, and others, and is in a rectangular shape. The pressing member 6 is a plate formed of a metal material or a rigid plastic material, and has a pair of side walls 62 depending from the top plate. In its natural condition, the elastic member 5 has a thickness greater than the height of the side wall 62. The elastic member 5 should preferably have its width greater than a span between the inner surfaces of the two side walls 62. Accordingly, when the elastic member 5 is fitted in the pressing member 6, in advance of the tightening with the bolts, in such a manner as, for example, elastically deforming (or compressing) the elastic member 5 in its breadthwise direction to bring it into elastic contact with the side walls 62, both members can be integrally combined. In this case, the bottom end part of the elastic member 5 slightly protrudes from the bottom edge of the side walls 62. For the base plate 8, it is preferable to utilize ordinarily the main body of an appliance such as, for example, a part of the frame for constructing the camera body, on which the printed wiring boards are mounted. It may also be feasible to provide, as the base plate, a separate chip of an appropriate size made of a metal material or a rigid plastic material.

When joining the two printed wiring boards 2, 4, they are placed on the base plate 8 in a mutually layed-over condition, on which there is further placed the combination of the pressing member 6 and the elastic member 5; then the bolts 7 are inserted to pass the through the holes 61 and 51, and screwed into the threaded holes 81 in the base plate 8 for fastening the assembly together. At this time, tightening force is applied to the printed wiring boards through the elastic member 5, so that any irregularity in the tightening force caused by irregularity in rotation of the bolts 7 is absorbed into the elastic member 5 by its elastic deformation, whereby substantially constant tightening force is always applied to the printed wiring boards 2, 4. The pair of side walls 62 of the pressing member 6 serve to restrain the lateral deformation of the elastic member 5 and to increase the pressing force to the printed wiring boards, as they are being tightened with the bolts. The side walls 62 also serve to limit the maximum amount of tightening of the bolts 7, i.e., the maximum amount of the elastic deformation of the elastic member 5, and further act as reinforcing ribs for the pressing member 6 to prevent it from being deformed at the tightening operation.

Figure 2:
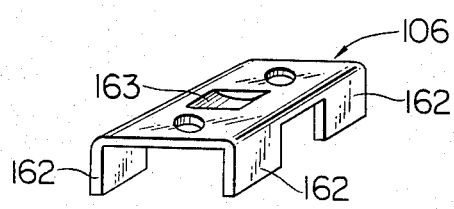
FIG. 2 is a perspective view showing a modified embodiment of a pressing member.

FIG. 2 illustrates a modified embodiment concerning the shape of the pressing member. The pressing member 106 shown in FIG. 2 has two pairs of side walls 162 with the same function as the side walls 62 of the abovementioned pressing member 6 shown in FIG. 1. At substantially the center of the top plate of the pressing member 106, there is formed a deformed portion 163 by press working the outer surface of the top plate downward to its inner surface with a press machine. Consequently, this deformed portion 163 provides a protrusion on the inner surface of the top plate of the pressing member 106.

Figure 3:
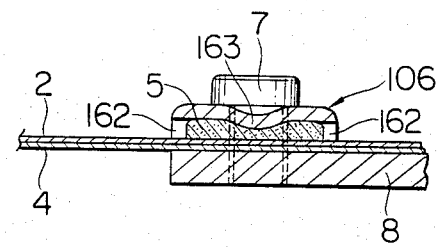
FIG. 3 is a cross-sectional view of the connecting device using the pressing member shown in FIG. 2.

When the printed wiring boards 2, 4 are joined by use of this pressing member 106 together with the aforementioned elements 5, 7 and 8, as shown in FIG. 3, the protrusion at the deformed portion 163 urges more strongly the center part of the elastic member 5 at the time of the tightening operations. This urging force disperses relatively uniformly within the elastic member 5 due to the synergistic action of this deformed portion 163 and the side walls 162, and acts on the printed wiring boards 2, 4 as a large and uniform press-contacting force. As the consequence of this, the circuits on these two printed wiring boards are electrically connected without failure.

Figure 4:
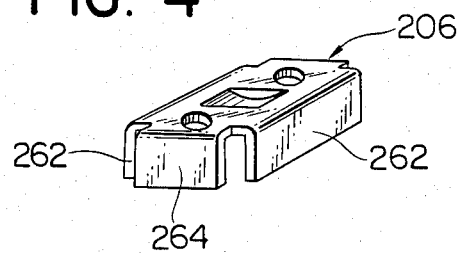
FIG. 4 is a perspective view showing another modification of the pressing member.

The pressing member may also be in the shape as shown in FIG. 4, wherein the member 206 has two pairs of side walls 262, 264 having an extent that is able to enclose and substantially surround the elastic member to thereby increase the press-contacting force much more.

In the foregoing, the present invention has been described with reference to the preferred embodiments thereof. It should, however, be noted that the invention is not limited to these embodiment alone, but any changes and modifications may be made by those persons skilled in the art within the ambit of the invention as recited in the appended claims.

We claim:

1. A device for mutually connecting a plurality of printed wiring boards or sheets, in which electrically conductive contacts provided on the surface of each of the printed wiring boards or sheets can be brought into mutual contact by overlapping their surfaces with the conductive contacts formed thereon, said device comprising:
   (a) a base plate, on which said plurality of overlapped printed wiring boards or sheets are mounted;
   (b) means for positioning said overlapped printed wiring boards or sheets on said base plate, said means including a pressing member having a top part disposed substantially in parallel with the surface of said boards or sheets and at least a pair of side walls having a predetermined height and extending downward from the top part to a surface of said boards or sheets and an elastic member of a thickness greater than the height of said side walls and disposed in the space between said pair of side walls;
   (c) said pressing member having a plurality of through holes and a protrusion projected from the surface of said top part opposite to said elastic member toward said overlapped printed wiring boards or sheets, the protrusion being located between the through holes;
   (d) said elastic member having a plurality of through holes corresponding to the positions of the through holes of said pressing member; and
   (e) pressure applying means which pass through said holes of said pressing member and corresponding holes of said elastic member, respectively, to fasten said pressing member to said base plate to apply a pressing force to the electrically conductive contacts on said printed wiring boards or sheets through said elastic member.

2. The device as set forth in claim 1, wherein said elastic member is preformed with a width greater than a span between said pair of side walls, and is received in the space between said side walls in a state of its being compressed in the breadthwise direction.

3. The device as set forth in claim 1, wherein the pair of side walls of said pressing member are parallel each other, and depend substantially perpendicularly from said top part.

* * * * *